(12) United States Patent
Otremba et al.

(10) Patent No.: US 8,853,835 B2
(45) Date of Patent: Oct. 7, 2014

(54) CHIP ARRANGEMENTS, A CHIP PACKAGE AND A METHOD FOR MANUFACTURING A CHIP ARRANGEMENT

(71) Applicant: Infineon Technologies AG, Neubiberg (DE)

(72) Inventors: Ralf Otremba, Kaufbeuren (DE); Josef Hoeglauer, Heimstetten (DE); Gerhard Noebauer, Villach (AT); Chooi Mei Chong, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 62 days.

(21) Appl. No.: 13/645,548

(22) Filed: Oct. 5, 2012

(65) Prior Publication Data

US 2014/0097528 A1    Apr. 10, 2014

(51) Int. Cl.
*H01L 23/495* (2006.01)

(52) U.S. Cl.
USPC ........... 257/666; 257/676; 257/678; 257/787; 257/E23.014

(58) Field of Classification Search
USPC ................. 257/666–667, 676, 686, 672, 678, 257/691–692, 787, E23.014
See application file for complete search history.

(56) References Cited

U.S. PATENT DOCUMENTS

| | | | |
|---|---|---|---|
| 5,399,905 A * | 3/1995 | Honda et al. | 257/666 |
| 6,307,272 B1 * | 10/2001 | Takahashi et al. | 257/787 |
| 6,329,707 B1 * | 12/2001 | Hayasi | 257/676 |
| 2009/0212284 A1 | 8/2009 | Otremba et al. | |

FOREIGN PATENT DOCUMENTS

DE    102009009874 A1    9/2009

* cited by examiner

*Primary Examiner* — Dung A. Le

(57) ABSTRACT

A chip package is provided. The chip package includes a chip carrier, a voltage supply lead, a sensing terminal and a chip disposed over the chip carrier. The chip includes a first terminal and a second terminal, wherein the first terminal electrically contacts the chip carrier. The chip package also includes an electrically conductive element formed over the second terminal, the electrically conductive element electrically coupling the second terminal to the voltage supply lead and the sensing terminal.

25 Claims, 7 Drawing Sheets

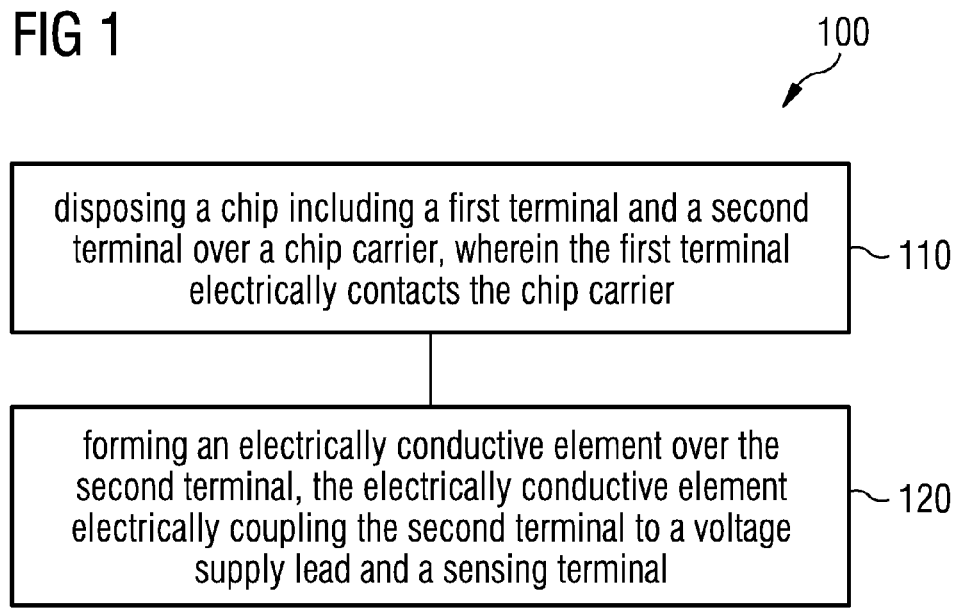

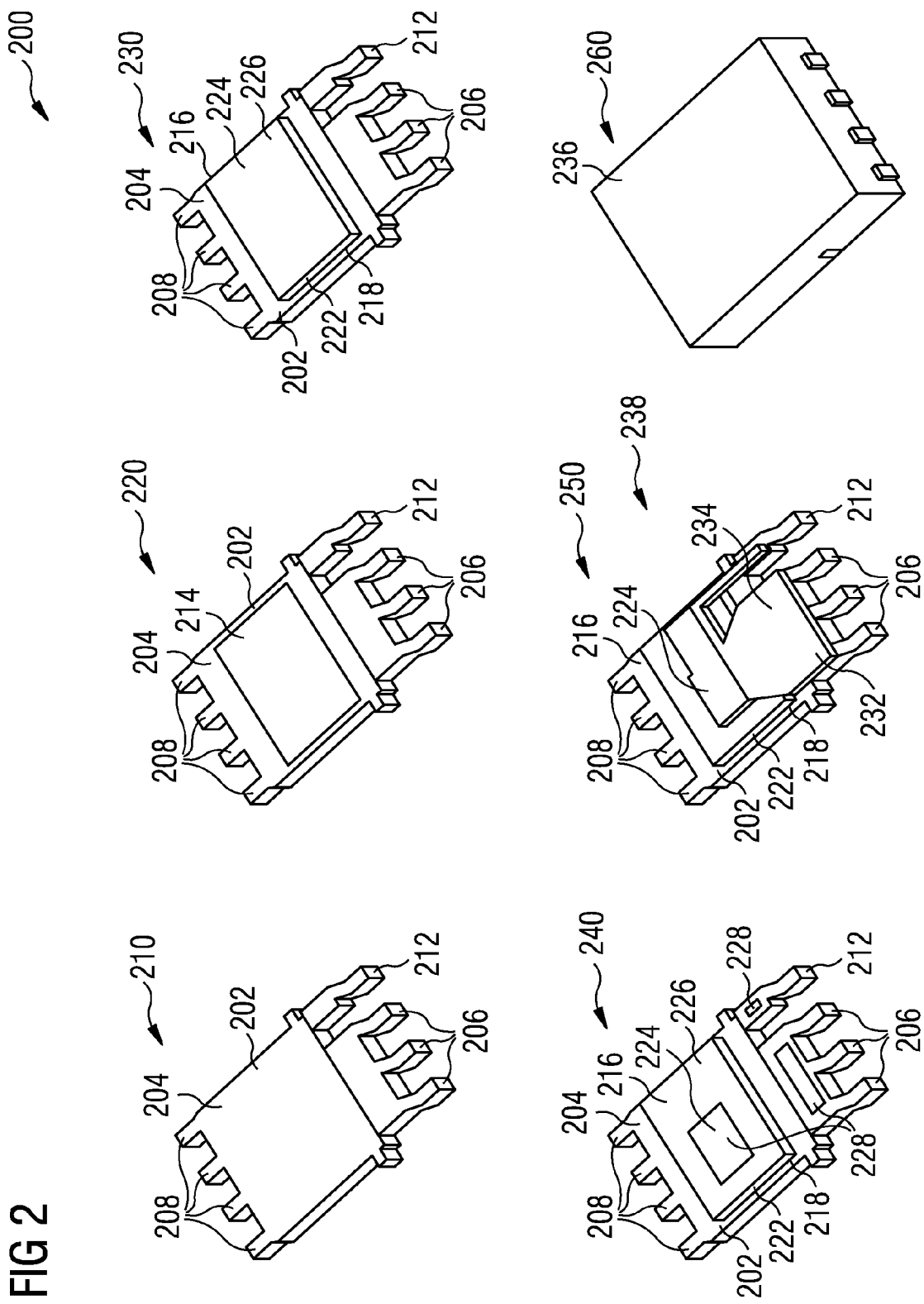

CHIP ARRANGEMENTS, A CHIP PACKAGE AND A METHOD FOR MANUFACTURING A CHIP ARRANGEMENT

TECHNICAL FIELD

Various embodiments relate generally to chip arrangements, a chip package and a method for manufacturing a chip arrangement.

BACKGROUND

Chip contact regions, such as source and/or drain contacts are each normally supplied with voltage through connecting elements, such as electrically conductive wires, electrically conductive leads or clips. Furthermore, a source-sensing lead may be connected to a source contact to measure and/or monitor the potential of the source contact. Source-sensing leads may be connected to the source contact through additional redistribution elements, such as through an electrically conductive wire. The electrically conductive wire may be connected to a source contact, e.g. by wire bonding. These multiple contacting mechanisms may lead to additional packaging costs, which in particular may be attributed to the need for extra source-sensing leads.

SUMMARY

Various embodiments provide a chip package including: a chip carrier; a voltage supply lead; a sensing terminal; a chip disposed over the chip carrier, the chip including a first terminal and a second terminal, wherein the first terminal electrically contacts the chip carrier; an electrically conductive element formed over the second terminal, the electrically conductive element electrically coupling the second terminal to the voltage supply lead and the sensing terminal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a method for manufacturing a chip arrangement according to various embodiments;

FIG. 2 shows illustrative views of a method for manufacturing a chip arrangement according to various embodiments;

DETAILED DESCRIPTION

Figure 3A:
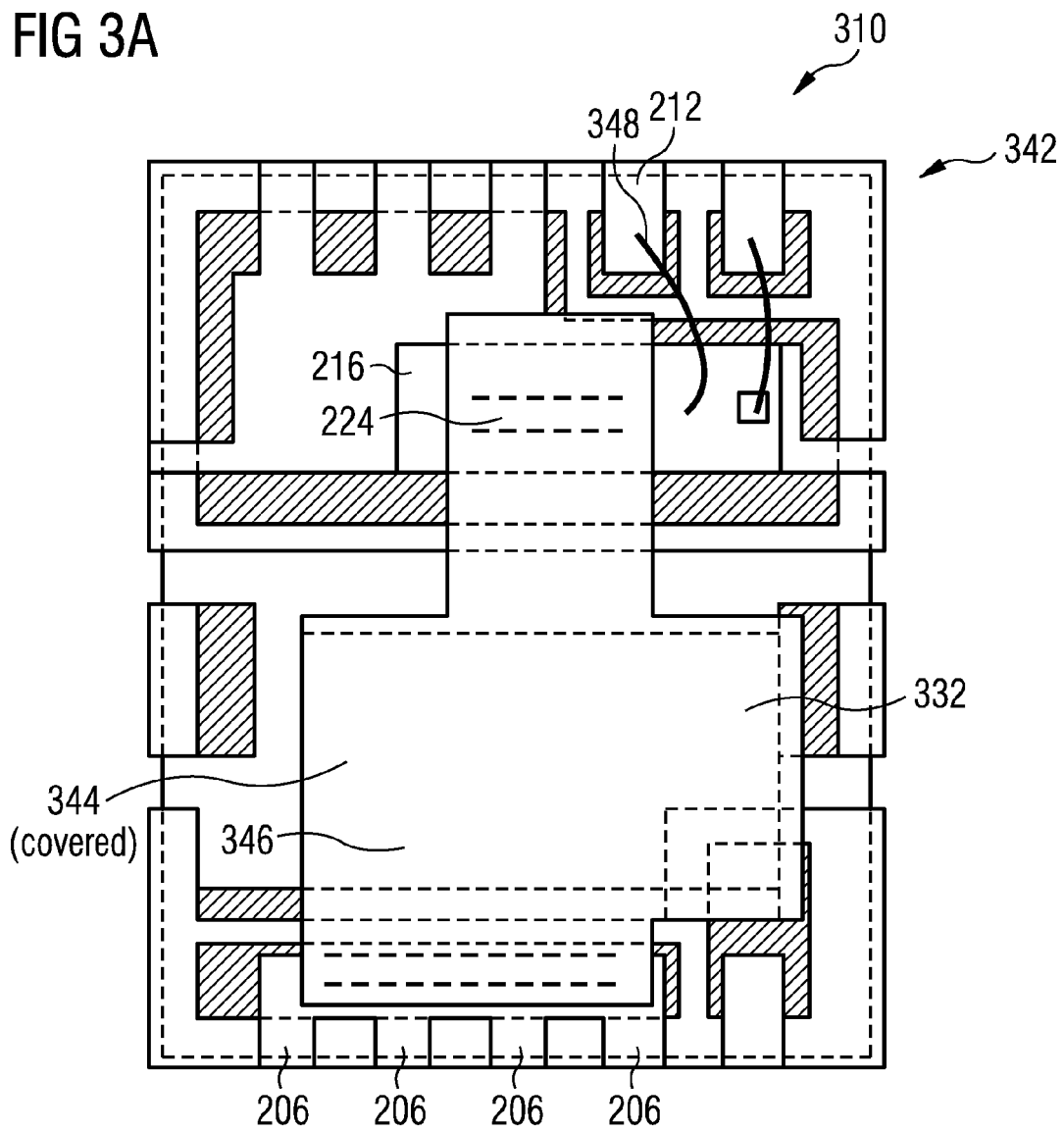
FIG. 3A shows a top view illustration of a chip arrangement.

The following detailed description refers to the accompanying drawings that show, by way of illustration, specific details and embodiments in which the invention may be practiced.

The word "exemplary" is used herein to mean "serving as an example, instance, or illustration" or the like. Any embodiment or design described herein as "exemplary" is not necessarily to be construed as preferred or advantageous over other embodiments or designs.

The word "over" is used herein to describe forming a feature, e.g. a layer, "over" a side or surface, and may be used to mean that the feature, e.g. the layer may be formed "directly on," e.g. in direct contact with, the implied side or surface. The word "over" may also be used herein to describe forming a feature, e.g. a layer "over" a side or surface, and may be used to mean that the feature, e.g. the layer may be formed "indirectly on" the implied side or surface with one or more additional layers being arranged between the implied side or surface and the formed layer.

Various embodiments provide a chip arrangement which may use a contact clip for source sensing, while avoiding the use of an additional wire bond (WB) for source sensing.

FIG. 1 shows method 100 for manufacturing a chip arrangement according to an embodiment. Method 100 may include:

disposing a chip including a first terminal and a second terminal over a chip carrier, wherein the first terminal electrically contacts the chip carrier (in 110); and forming an electrically conductive element over the second terminal, the electrically conductive element electrically coupling the second terminal to a voltage supply lead and a sensing terminal (in 120).

FIG. 2 shows illustrative views 210 to 260 of method 200 for manufacturing a chip arrangement according to an embodiment. Method 200 may include one or more or all of the processes already described with respect to method 100.

Method 200 may include, as shown in view 210, providing chip carrier 202. Chip carrier 202 may include at least part of a leadframe. For example, chip carrier may include at least one material, element or alloy from the following group of materials, the group consisting of: copper, aluminum, silver, tin, gold, palladium, zinc, nickel, iron. Chip carrier 202 may include at least one substantially planar surface 204. Furthermore, one or more electrically conductive leads may be provided. As shown as an example, for the purposes of illustration, the one or more electrically conductive leads may include one or more voltage supplying leads 206, e.g. source leads, one or more further voltage supply leads 208, e.g. drain leads and sensing terminal 212. The one or more leads may include a leadframe material. As an example, the one or more leads may be electrically conductive legs or extensions which may be or may have been part of a leadframe. The one or more leads may include at least one material, element or alloy from the following group of materials, the group consisting of: copper, aluminum, silver, tin, gold, palladium, zinc, nickel, iron.

As shown in view 220, electrically conductive joining material 214 may be deposited over planar surface 204 of chip carrier 202 for the die attachment. Electrically conductive joining material 214 may include at least one of an adhesive and a solder material. As an example, electrically conductive joining material 214 may include at least one from the following group of materials, the group consisting of: a solder, a soft solder, a diffusion solder, a paste, a nanopaste, an adhesive, an electrically conductive adhesive. Electrically conductive joining material 214 may be spread or distributed over planar surface 204 of chip carrier 202 in preparation for the placement of a die or chip.

As shown in view 230, chip 216 may be disposed over chip carrier 202. Chip 216 may include first terminal 218, e.g. a first source/drain contact 218 on chip first side 222, which may be the downward facing side of chip 216. Chip 216 may be solder attached to chip carrier 202. Chip 216 may be arranged over chip carrier 202, wherein first terminal 218 may face chip carrier 202, and first terminal 218 may electrically contact chip carrier 202. First source/drain contact 218 may be directly electrically coupled to chip carrier 202 via electrically conductive joining material 214. Further voltage supply leads 208 may be physically and electrically joined to chip carrier 202. Further voltage supply leads 208 may be configured to supply a voltage to first terminal 218. Chip 216 may also include second terminal 224, e.g. a second source/drain contact 224 formed over second chip side 226, i.e. on upward facing side of chip 216. Second chip side 226 may face a direction substantially opposite to first chip side 222.

Chip 216 may include a vertical device, in that, for example, a drain contact, e.g. first source/drain contact 218, may be formed on chip first side 222, and a source contact, e.g. second source/drain contact 224, may be formed on chip second side 226. Chip 216 may support a current flow, which may flow vertically through chip 216, e.g. between source contact 224 and drain contact 218. Chip 216 may include a power semiconductor device. Chip 216 may include at least one power semiconductor device from the group of power semiconductor devices consisting of: a power transistor, a power MOS transistor, a power bipolar transistor, a power field effect transistor, a power insulated gate bipolar transistor, a thyristor, a MOS controlled thyristors, a silicon controlled rectifier and a power schottky diode.

As shown in view 240, further electrically conductive joining material 228 may be deposited over second chip side 226. Further electrically conductive joining material 228 may be analogous to electrically conductive joining material 214 already described above. Further electrically conductive joining material 228, e.g. a solder paste layer, may be deposited over second terminal 224, e.g. over second source/drain contact 224. Further electrically conductive joining material 228 may also be deposited over voltage supplying leads 206 and sensing terminal 212.

As shown in view 250, electrically conductive element 232 may be formed over second terminal 224. Electrically conductive element 232 may include a contact clip. The contact clip may include at least one substantially planar surface 234 which may be used to hold chip 216 in place over chip carrier 202. Electrically conductive element 232, e.g. the contact clip, may be formed from a lead frame material. Electrically conductive element 232 may include at least one material, element or alloy from the following group of materials, the group consisting of: copper, aluminum, silver, tin, gold, palladium, zinc, nickel, iron.

Substantially planar surface 234 may cover at least part of second terminal 224. Substantially planar surface 234 may have a surface area greater than a surface area of second terminal 234, e.g. greater than about 30% of a surface area of second terminal 224, e.g. greater than about 50% of a surface area of second terminal 234, e.g. greater than about 70% of a surface area of second terminal 234, e.g. greater than about 90% of a surface area of second terminal 234. Electrically conductive element 232 may be formed over greater than about 30% of a surface area of second terminal 224, e.g. greater than about 50% of a surface area of second terminal 234, e.g. greater than about 70% of a surface area of second terminal 234, e.g. greater than about 90% of a surface area of second terminal 234, e.g. about 100% of a surface area of second terminal 234. Substantially planar surface 234 of electrically conductive element 232 may be electrically coupled to second terminal 224 via further electrically conductive joining material 228 disposed over second terminal 224. Electrically conductive element 232 may have a surface area ranging from about 0.1 mm² to about 10 mm², for example, ranging from about 0.1 mm² to about 1 mm²

Electrically conductive element 232 may also be formed over voltage supplying leads 206 and sensing terminal 212. Electrically conductive element 232 may be physically and electrically connected to voltage supply leads 206. Electrically conductive element 232 may be electrically coupled to voltage supply leads 206 by means of a solder material, e.g. further electrically conductive joining material 228. Electrically conductive element 232 may be soldered to voltage supply 206 leads via a solder material such as further electrically conductive joining material 228. Electrically conductive element 232 may be physically and electrically connected to sensing terminal 212. Electrically conductive element 232 may be soldered to sensing terminal 212 via a solder material such as further electrically conductive joining material 228. Electrically conductive element 232 may therefore electrically couple second terminal 224 to voltage supply leads 206 and sensing terminal 212.

As shown in view 260, encapsulation material 236 may be deposited over electrically conductive element 232, and wherein encapsulation material 236 may surround chip 216 and the one or more leads. Encapsulation material 236 may be deposited over second chip side 226 and over planar surface 204 of chip carrier 202. Encapsulation material may also at least partially surround the one or more leads including voltage supplying leads 206, one or more further voltage supply leads 208 and sensing terminal 212. Encapsulation material 236 may at least partially surround chip 216, thereby electrically insulating parts of chip 216 from it environment. Encapsulation material 236 may include a mold compound, typically used for chip packaging. For example, encapsulation material 236 may include at least one of filled or unfilled epoxy, pre-impregnated composite fibers, reinforced fibers, laminate, a mold material, a thermoset material, a thermoplastic material, filler particles, fiber-reinforced laminate, fiber-reinforced polymer laminate and fiber-reinforced polymer laminate with filler particles.

Chip package 238 according to various embodiments, is shown in view 250. Chip package 238 may include: chip carrier 202, voltage supply leads 206 and sensing terminal 212. Chip package 238 may include chip 216, which may be disposed over chip carrier 202. Chip 216 may include first terminal 218 and second terminal 224. First terminal 218 may electrically contact chip carrier 202. Chip package 238 may include electrically conductive element 232 which may be formed over second terminal 224. Electrically conductive element 232 may thereby electrically couple second terminal 224 to voltage supply leads 206 and sensing terminal 212. According to various embodiments, chip package 238 may also include encapsulation material 236 as shown in view 260.

Figure 3B:
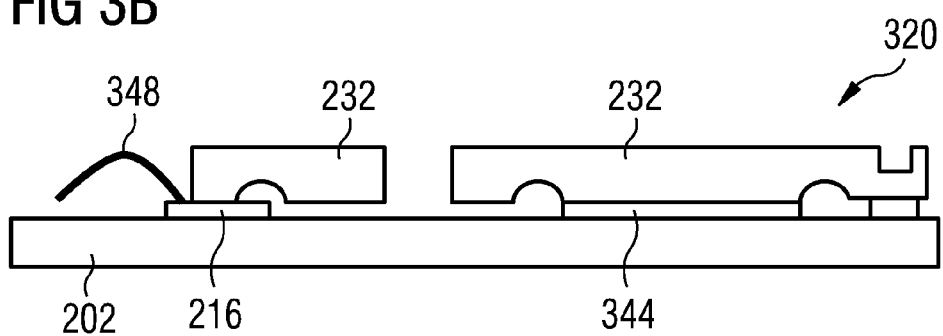
FIG. 3B shows a cross-sectional illustration of a chip arrangement.

FIG. 3A shows in view 310 a top view illustration of a chip arrangement 342. FIG. 3B shows in view 320 a cross-sectional illustration of chip arrangement 342. Chip arrangement 342 may include a multi-chip device. Chip arrangement 342 may include chip 216 and chip 344. Chip 216 and chip 344 may disposed over chip carrier 202, and first terminal 218 (facing down and therefore not shown) may electrically contact chip carrier 202. Electrically conductive element 332 may be formed over at least part of chip 216, e.g. electrically conductive element 332 may be formed over second terminal 224. As chip arrangement 342 may include a multi-chip arrangement, chip 216 and chip 344 may be arranged, for example, in a half-bridge circuit arrangement. That is, electrically conductive element 332 may be formed over second terminal 224 e.g. a source contact of chip 216 and over further terminal 346 of chip 344. Further terminal 346 may include, e.g. a drain contact. Electrically conductive element 332 may electrically couple second terminal 224 and further terminal 346 to voltage supply leads 206. Voltage supply leads 206 may supply a voltage to both second terminal 224 and further terminal 346.

Typically, sensing terminal 212 may be electrically coupled to part of second terminal 224, typically via a wire bond 348 or ribbon bond 348. Wire bond/ribbon bond 348 may lead to additional processing costs, and furthermore, may take up space on second terminal 224, which may otherwise be covered by electrically conductive element 332. Chip arrangement 342 may include part of a standard power chip package such as a TO220-3 chip package.

Figure 3C:
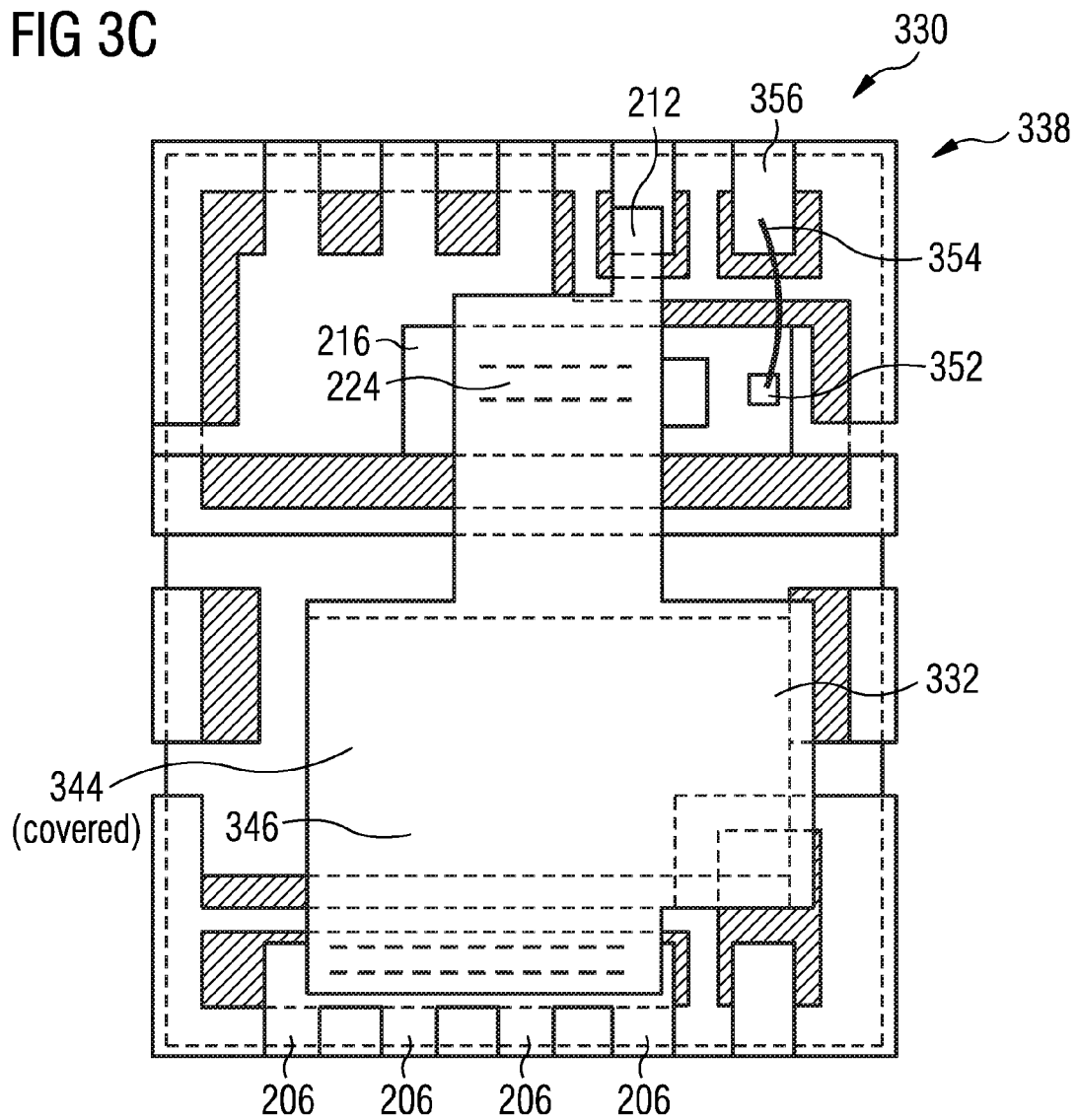
FIG. 3C shows a top view illustration of a chip arrangement according to various embodiments.
Figure 3D:
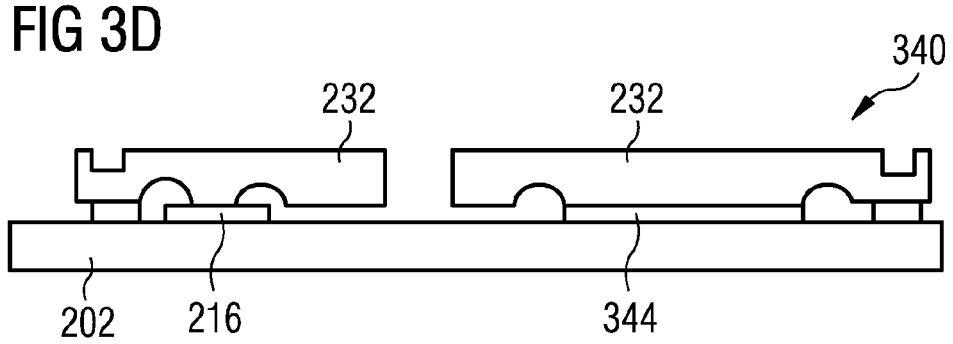
FIG. 3D shows a cross-sectional illustration of a chip arrangement according to various embodiments.

FIG. 3C shows in view 330 a top view illustration of chip arrangement 338 according to an embodiment. FIG. 3D shows in view 340 a cross-sectional illustration of chip arrangement 338 according to an embodiment. Chip arrangement 338 may include the properties and features of chip arrangement 342, however wire bond/ribbon bond 348 may be eliminated. Electrically conductive element 332 may be replaced by electrically conductive element 232 which may electrically couple second terminal 224 and further terminal 346 to voltage supply leads 206 as well as sensing terminal 212. Furthermore, electrically conductive element 232 may be enlarged, compared to electrically conductive element 332, and the contact area between electrically conductive element 232 and second terminal 224 may be increased, because electrically conductive element 232 may even be formed over space no longer taken up by wire bond/ribbon bond 348. The increased area for supplying a voltage, e.g. for supplying a source voltage may improve the performance of the electrical device. Furthermore, an increase in the contact area and the size of electrically conductive element 232 may lead to improved cooling of side 226, i.e. better top side cooling.

According to various embodiments, chip arrangement 338 may include at least one further lead 356 and at least one wire bond/ribbon bond 354; wherein wire bond/ribbon bond 354 may electrically couple further lead 356 to chip 216. In an embodiment, as shown in FIG. 3C, chip 216 may further include third terminal 352. Third terminal 352 may be disposed or formed over second chip side 226, for example on the same side of chip 216 as second terminal 352. While second terminal 224 may include a source contact, third terminal 352 may include a gate contact. Wire bond/ribbon bond 354 may electrically couple at least one further lead 356 to third terminal 352. Further lead 356 may supply a voltage to third terminal 352, i.e. the gate contact.

Figure 4:
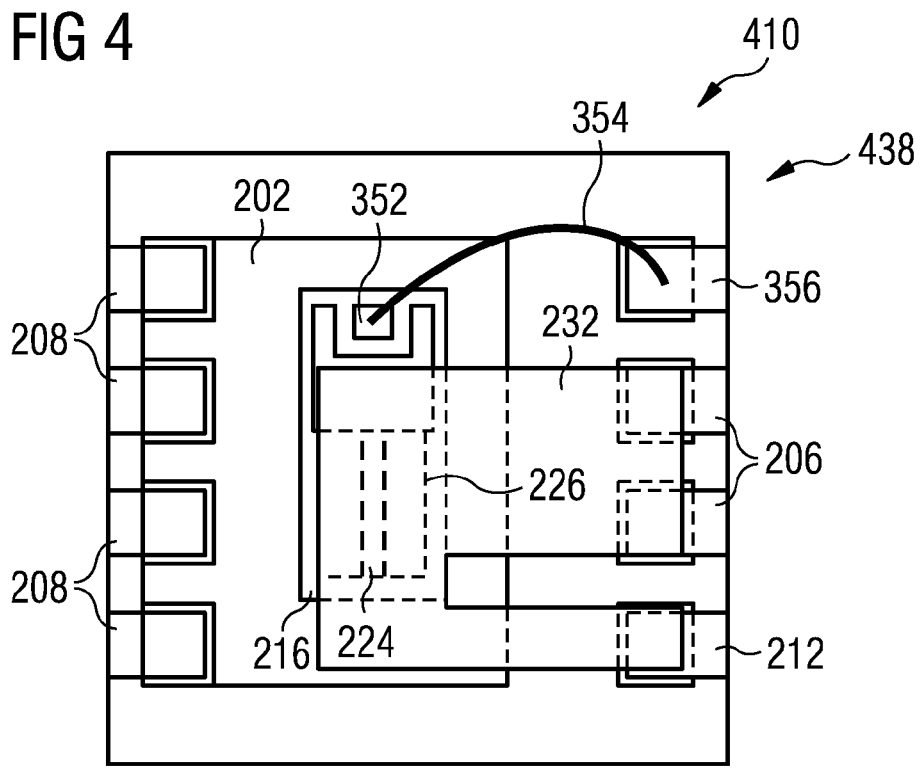
FIG. 4 shows a top view of a chip arrangement according to various embodiments.
Figure 5:
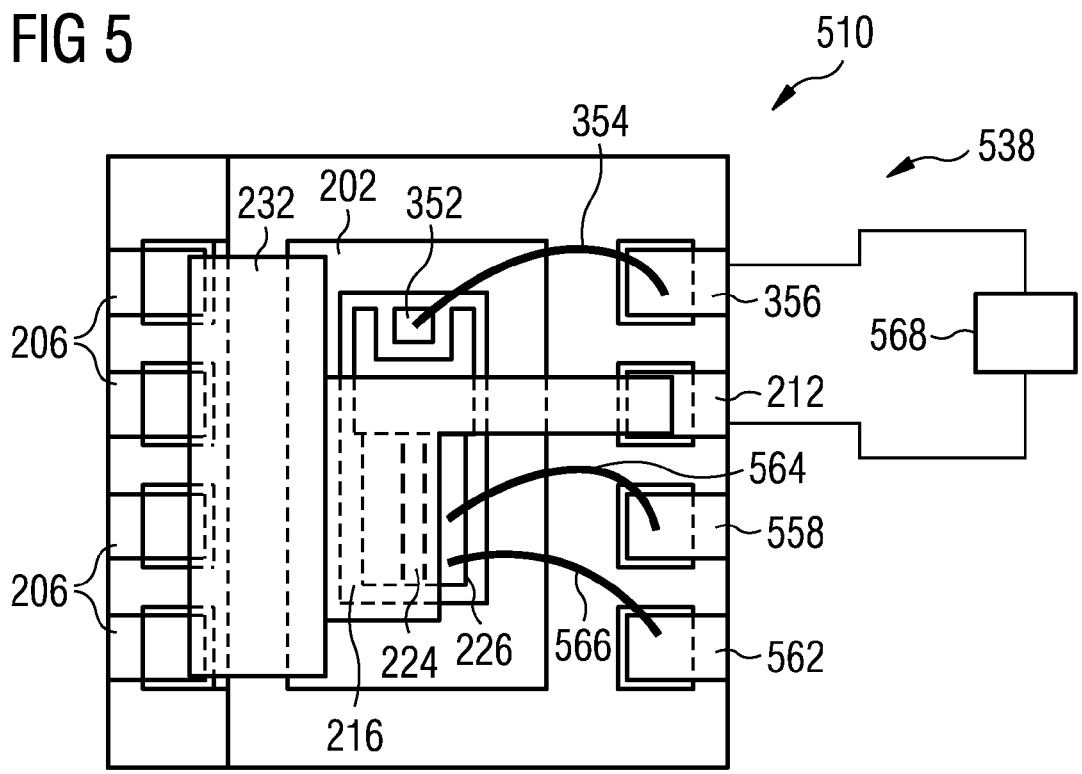
FIG. 5 shows a top view of a chip arrangement according to various embodiments.

FIGS. 4 and 5 show top views 410 and 510 of chip arrangements according to various embodiments.

Chip arrangement 438 in top view 410 shows chip 216. Chip 216 may include bottom contact 218, e.g. first terminal, e.g. drain contact, disposed over a side 222 of chip 216. Side 222 may be the downward facing side and therefore bottom contact 218 and side 222 may not be visible from top view 410. Chip arrangement 438 may include voltage supply leads 206, e.g. source leads. Chip arrangement 438 may include sensing terminal 212, e.g. a source sensing lead. Chip arrangement 438 may include further voltage supply leads 208, e.g. drain leads. Chip arrangement 438 may include further lead 356, e.g. a gate lead. Chip 216 may be formed over chip carrier 202. That is, bottom contact 218 may be arranged faced downwards over chip carrier 202. Bottom contact 218, i.e. drain contact may be electrically connected or joined to chip carrier 202. Further voltage supply leads 208, e.g. drain leads, may provide a voltage to chip carrier 202, and therefore to bottom contact 218. Electrically conductive contact 224 may be formed on side 226 of chip 216. Electrically conductive element 232 may be formed over electrically conductive contact 224. Electrically conductive element 232 may electrically connect electrically conductive contact 224 to voltage supply leads 206, e.g. to one or more source leads. In other words, electrically conductive element 232 may provide a voltage to electrically conductive contact 224. A difference in voltage provided by voltage supply leads 206 to electrically conductive contact 224 and by further voltage supply leads 208 to bottom contact 218, may result in a potential difference between electrically conductive contact 224 and bottom contact 218, which may drive an electrical current between electrically conductive contact 224 and bottom contact 218, i.e. a vertical current between side 226 and side 222.

Electrically conductive element 232 may also electrically couple sensing terminal 212 to electrically conductive contact 224. Electrically conductive element 232 may be joined to electrically conductive contact 224 by means of solder paste, e.g. further electrically conductive joining material 228.

Chip 216 may further include third terminal 352, e.g. gate contact formed over second chip side 226. At least one wire bond/ribbon bond 354 may electrically couple further lead 356, e.g. gate lead, to third terminal 352, wherein further lead 356 may supply a voltage to third terminal 352, i.e. the gate contact.

FIG. 5 in top view 510 shows chip arrangement 538. Chip arrangement 538 may include one or more or all of the features already described with respect to chip arrangement 438. According to some embodiments, chip arrangement 538 may include further terminals 558, 562. As shown in top view 510, a first further terminal 558 may include a current sensing terminal, and a second further terminal 562 may include a temperature sensing terminal. Further terminals 558, 562 may each be electrically coupled to chip 216, for example, to electrically conductive contact 224 of chip 216, by wire bonds/ribbon bonds 564, 566 respectively. First further terminal 558 may be connected to a circuit configured to measure a temperature of electrically conductive contact 224. Second further terminal 562 may be connected to a circuit configured to measure a current at electrically conductive contact 224.

According to various embodiments, sensing terminal 212 already described herein with respect to chip arrangements 338, 438, 538 and chip package 238, may include a voltage sensing terminal. Sensing terminal 212 may form at least part of voltage sensing circuit 568. Voltage sensing circuit 568 may be configured to measure a voltage or potential of second terminal 224, i.e. electrically conductive contact 224, via sensing terminal 212. Voltage sensing circuit 568 may be further configured to determine a voltage to be provided by further lead 356 to third terminal 352, i.e. gate terminal 352. The voltage determined to be provided by further lead 356 to third terminal 352 may depend on the measured potential of second terminal by sensing terminal 212, voltage sensing circuit 568 and electrically conductive element 232.

Figure 6:
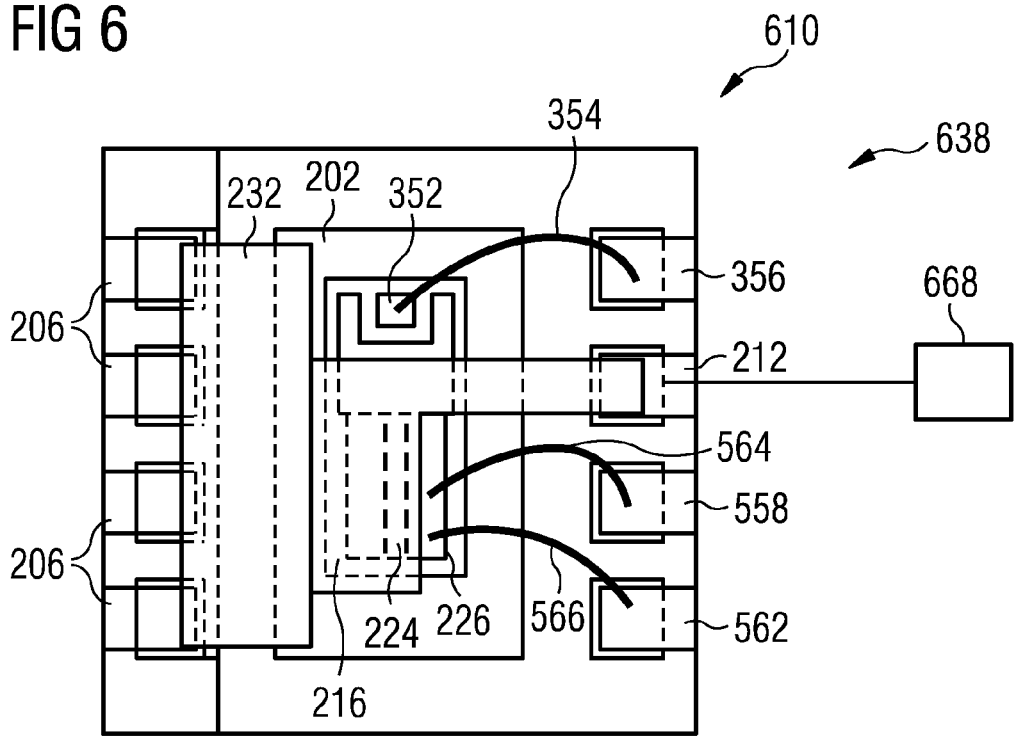
FIG. 6 shows a top view of a chip arrangement according to various embodiments.

As shown in top view 610 of FIG. 6, according to various other embodiments, sensing terminal 212 may form at least part of current sensing circuit 668. Current sensing circuit 668 may be configured to measure a current in second terminal 224, i.e. electrically conductive contact 224, via sensing terminal 212. In this embodiment, further terminal 558 may include a voltage sensing terminal, which may be connected to voltage sensing circuit 568 (not shown).

Figure 7:
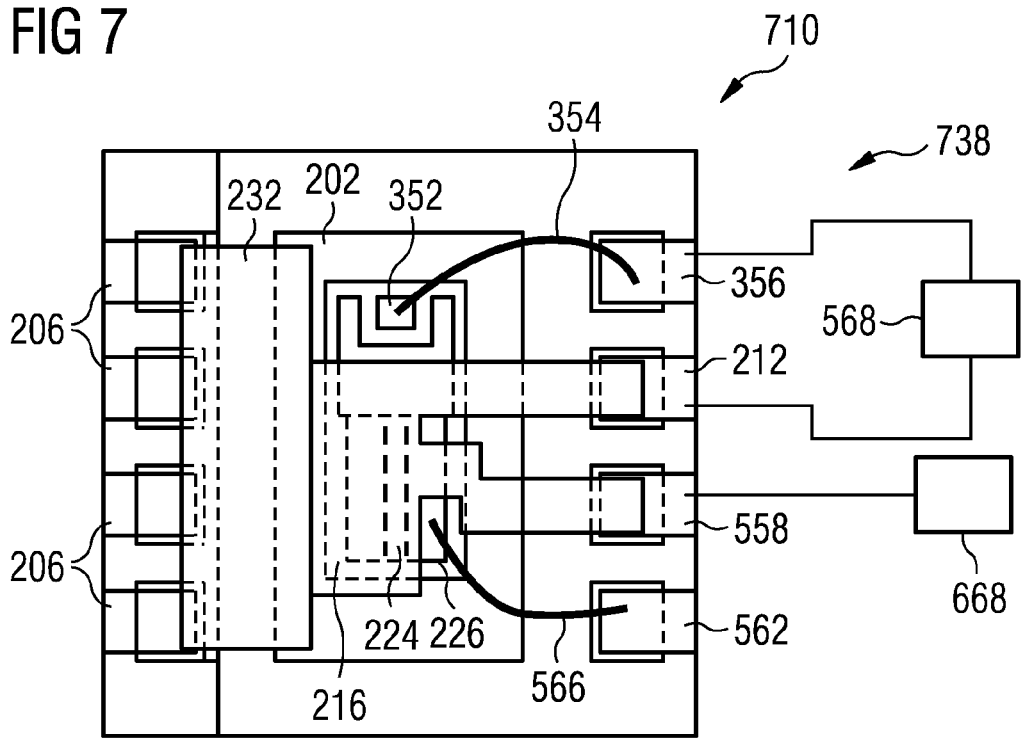
FIG. 7 shows a top view of a chip arrangement according to various embodiments.

As shown in top view 710 of FIG. 7, according to various other embodiments, electrically conductive contact 224 may electrically couple sensing terminal 212 to voltage sensing circuit 568, and further sensing terminal 558 to a further sensing circuit, i.e. current sensing circuit 668. Sensing terminal 212 may form at least part of voltage sensing circuit 568 configured to measure a voltage of second terminal 224, and further sensing terminal 558 may form at least part of current sensing circuit 668 configured to measure a current of second terminal 212.

Figure 8:
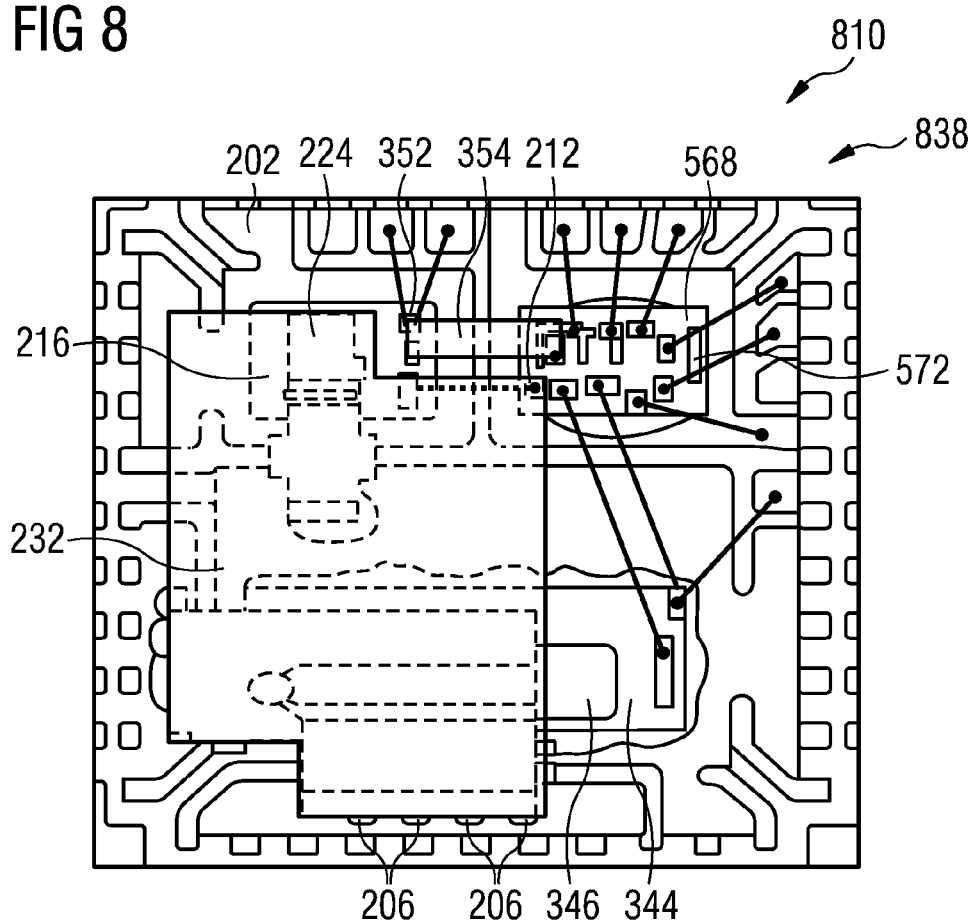
FIG. 8 shows a top view of a chip arrangement according to various embodiments.

FIG. 8 in top view 810 shows chip arrangement 838 according to an embodiment. Chip arrangement 838 may include a plurality of chips, which may be arranged for example, in a DrMOS power-half bridge with a gate integrated circuit. Chip arrangement 838 may include chips 216 and 344 which may be arranged in half-bridge configuration as described with respect to FIGS. 3A to 3D. Chip arrangement 838 may also include gate driver integrated circuit 572.

Chip arrangement 838 may include chip carrier 202. Chip 216 may include first terminal 218 facing downwards (not shown) electrically contacting chip carrier 202, and second terminal 224 facing upwards.

Electrically conductive element 232 may be formed over second terminal 224 of chip 216 and over further terminal 346 of chip 344. Electrically conductive element 232 may electrically couple second terminal 224 and further terminal 346 to voltage supply leads 206, wherein voltage supply leads 206 may supply a voltage to both second terminal 224 and further terminal 346. Electrically conductive element 232 may also electrically couple both second terminal 224 and further terminal 346 to sensing terminal 212. Sensing terminal 212 may form at least part of voltage sensing circuit 568. Voltage sensing circuit 568 may form part of gate driver circuit 572. Gate driver circuit 572 may be electrically coupled to third terminal 352, i.e. gate contact, via wire bond/ribbon bond 354. The voltage provided to third terminal 352 by wire bond/ribbon bond 354 may depend on the measured potential of second terminal by voltage sensing circuit 568.

Various embodiments provide chip arrangements and chip packages including sensing using a contact clip. Various chip arrangements and chip packages according to various embodiments may include chip arrangements and chip packages for power devices. Various embodiments may include chip arrangements and chip packages for power with sensing based on mixed logic distribution, e.g. using wire bonds and/or ribbon bonds and/or clips. Various embodiments may be implemented without significant additional packaging costs and labor.

Various embodiments provide a chip arrangement including: a chip carrier; a voltage supply lead; a sensing terminal; a chip disposed over the chip carrier, the chip including a first terminal and a second terminal, wherein the first terminal electrically contacts the chip carrier; and an electrically conductive element formed over the second terminal, the electrically conductive element electrically coupling the voltage supply lead to the second terminal; wherein the electrically conductive element further electrically couples the second terminal to the sensing terminal.

According to an embodiment, the chip carrier includes at least part of a leadframe.

According to an embodiment, the voltage supply lead includes at least part of a leadframe.

According to an embodiment, the chip carrier includes at least one material, element or alloy from the following group of materials, the group consisting of: copper, aluminum, silver, tin, gold, palladium, zinc, nickel, iron.

According to an embodiment, the chip includes a power semiconductor device.

According to an embodiment, the first terminal includes a first source/drain contact formed over a first chip side.

According to an embodiment, the first source/drain contact is electrically coupled to the chip carrier via an electrically conductive joining material.

According to an embodiment, the electrically conductive joining material includes at least one of an adhesive and a solder material.

According to an embodiment, the electrically conductive element includes a contact clip.

According to an embodiment, the electrically conductive element includes at least one material, element or alloy from the following group of materials, the group consisting of: copper, aluminum, silver, tin, gold, palladium, zinc, nickel, iron.

According to an embodiment, the electrically conductive element includes at least one substantially planar surface; and the at least one substantially planar surface covers at least part of the second terminal.

According to an embodiment, the at least one substantially planar surface is electrically coupled to the second terminal via a solder paste layer disposed over the second terminal.

According to an embodiment, the second terminal includes a second source/drain contact formed over a second chip side, the second chip side facing a direction opposite to the first chip side.

According to an embodiment, the second terminal has a surface area; and the electrically conductive element is formed over greater than about 30% of the surface area of the second terminal.

According to an embodiment, the electrically conductive element is electrically coupled to the voltage supply lead by means of a solder material.

According to an embodiment, the electrically conductive element is physically and electrically connected to the voltage supply lead.

According to an embodiment, the electrically conductive element is soldered to the voltage supply lead via a solder material.

According to an embodiment, the electrically conductive element is physically and electrically connected to the sensing terminal.

According to an embodiment, the electrically conductive element is soldered to the sensing terminal via a solder material.

According to an embodiment, the sensing terminal forms at least part of a voltage sensing circuit configured to measure a voltage of the second terminal.

According to an embodiment, the sensing terminal forms at least part of a current sensing circuit configured to measure a current of the second terminal.

According to an embodiment, the chip arrangement may further include a further sensing terminal, wherein the electrically conductive element further electrically couples the second terminal to the further sensing terminal, wherein the sensing terminal forms at least part of a voltage sensing circuit configured to measure a voltage of the second terminal, and wherein the further sensing terminal forms at least part of a current sensing circuit configured to measure a current of the second terminal.

According to an embodiment, the chip arrangement further includes at least one further lead; and at least one wire bond; wherein the at least one wire bond electrically couples the at least one further lead to the chip.

According to an embodiment, the chip further includes a third terminal; and the at least one wire bond electrically couples the at least one further lead to the second terminal or the third terminal.

Various embodiments provide a chip arrangement including: a chip including an electrically conductive contact disposed over a side of the chip; a voltage supply lead; a sensing terminal; an electrically conductive element formed over the electrically conductive contact, wherein the electrically conductive element electrically connects the electrically conductive contact to the voltage supply lead and the sensing terminal.

Various embodiments provide a chip package including: a chip carrier; a voltage supply lead; a sensing terminal; a chip disposed over the chip carrier, the chip including a first terminal and a second terminal, wherein the first terminal electrically contacts the chip carrier; an electrically conductive element formed over the second terminal, the electrically conductive element electrically coupling the second terminal to the voltage supply lead and the sensing terminal.

Various embodiments provide a method for manufacturing a chip arrangement, the method including: disposing a chip including a first terminal and a second terminal over a chip carrier, wherein the first terminal electrically contacts the chip carrier; and forming an electrically conductive element over the second terminal, the electrically conductive element electrically coupling the second terminal to a voltage supply lead and a sensing terminal.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip arrangement comprising:
   a chip carrier;
   a voltage supply lead;
   a sensing terminal;
   a chip disposed over the chip carrier, the chip comprising a first terminal and a second terminal, wherein the first terminal electrically contacts the chip carrier; and
   an electrically conductive element formed over the second terminal, the electrically conductive element electrically coupling the voltage supply lead to the second terminal;
   wherein the electrically conductive element further electrically couples the second terminal to the sensing terminal.

2. The chip arrangement according to claim 1, wherein the chip carrier comprises at least part of a leadframe.

3. The chip arrangement according to claim 1, wherein the voltage supply lead comprises at least part of a leadframe.

4. The chip arrangement according to claim 1, wherein the chip carrier comprises at least one material, element or alloy from the following group of materials, the group consisting of: copper, aluminum, silver, tin, gold, palladium, zinc, nickel, iron.

5. The chip arrangement according to claim 1, wherein the chip comprises a power semiconductor device.

6. The chip arrangement according to claim 1, wherein the first terminal comprises a first source/drain contact formed over a first chip side.

7. The chip arrangement according to claim 6, wherein the first source/drain contact is electrically coupled to the chip carrier via an electrically conductive joining material.

8. The chip arrangement according to claim 7, wherein the electrically conductive joining material comprises at least one of an adhesive and a solder material.

9. The chip arrangement according to claim 1, wherein the electrically conductive element comprises a contact clip.

10. The chip arrangement according to claim 1, wherein the electrically conductive element comprises at least one material, element or alloy from the following group of materials, the group consisting of: copper, aluminum, silver, tin, gold, palladium, zinc, nickel, iron.

11. The chip arrangement according to claim 1, wherein the electrically conductive element comprises at least one substantially planar surface;
wherein the at least one substantially planar surface covers at least part of the second terminal.

12. The chip arrangement according to claim 11, wherein the at least one substantially planar surface is electrically coupled to the second terminal via a solder paste layer disposed over the second terminal.

13. The chip arrangement according to claim 1, wherein the second terminal comprises a second source/drain contact formed over a second chip side, the second chip side facing a direction opposite to the first chip side.

14. The chip arrangement according to claim 1, wherein the second terminal has a surface area; and
wherein the electrically conductive element is formed over greater than about 30% of the surface area of the second terminal.

15. The chip arrangement according to claim 1, wherein the electrically conductive element is electrically coupled to the voltage supply lead by means of a solder material.

16. The chip arrangement according to claim 1, wherein the electrically conductive element is physically and electrically connected to the voltage supply lead.

17. The chip arrangement according to claim 1, wherein the electrically conductive element is soldered to the voltage supply lead via a solder material.

18. The chip arrangement according to claim 1, wherein the electrically conductive element is physically and electrically connected to the sensing terminal.

19. The chip arrangement according to claim 1, wherein the electrically conductive element is soldered to the sensing terminal via a solder material.

20. The chip arrangement according to claim 1, wherein the sensing terminal forms at least part of a voltage sensing circuit configured to measure a voltage of the second terminal.

21. The chip arrangement according to claim 1, wherein the sensing terminal forms at least part of a current sensing circuit configured to measure a current of the second terminal.

22. The chip arrangement according to claim 1, further comprising
a further sensing terminal, wherein the electrically conductive element further electrically couples the second terminal to the further sensing terminal;

wherein the sensing terminal forms at least part of a voltage sensing circuit configured to measure a voltage of the second terminal, and wherein the further sensing terminal forms at least part of a current sensing circuit configured to measure a current of the second terminal.

23. The chip arrangement according to claim 1, further comprising
at least one further lead; and
at least one wire bond;
wherein the at least one wire bond electrically couples the at least one further lead to the chip.

24. The chip arrangement according to claim 23,
wherein the chip further comprises a third terminal; and
wherein the at least one wire bond electrically couples the at least one further lead to the second terminal or the third terminal.

25. A method for manufacturing a chip arrangement, the method comprising:
disposing a chip comprising a first terminal and a second terminal over a chip carrier, wherein the first terminal electrically contacts the chip carrier; and
forming an electrically conductive element over the second terminal, the electrically conductive element electrically coupling the second terminal to a voltage supply lead and a sensing terminal.

* * * * *